Figure 1:
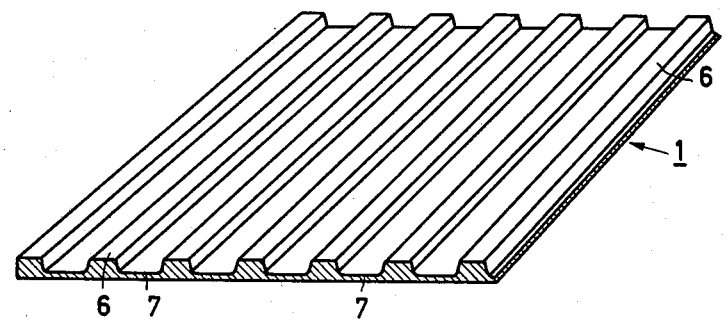

United States Patent [19]
deVries

[11] 4,389,276
[45] Jun. 21, 1983

[54] METHOD OF MANUFACTURING AN ELECTRIC DISCHARGE DEVICE COMPRISING A GLASS SUBSTRATE HAVING A PATTERN OF ELECTRODES

[75] Inventor: Gerhard H. F. deVries, Eindhoven, Netherlands

[73] Assignee: U.S. Philips Corporation, New York, N.Y.

[21] Appl. No.: 270,678

[22] Filed: Jun. 4, 1981

[30] Foreign Application Priority Data

Jun. 26, 1980 [NL] Netherlands ......................... 8003696

[51] Int. Cl.$^3$ .............................................. C23F 1/02
[52] U.S. Cl. ..................................... 156/630; 445/49; 156/273.1; 156/634; 156/656; 156/659.1
[58] Field of Search ................................. 156/629–634, 156/656, 659.1, 272.2, 273.1, 273.9, 651; 29/25.11, 25.13, 25.14, 25.17, 25.18; 65/36, 42, 50, 51, 54, 59.1, 59.3

[56] References Cited

U.S. PATENT DOCUMENTS

3,397,278  8/1968  Pomerantz ..................... 156/272 X

OTHER PUBLICATIONS

IBM Technical Disclosure Bulletin, vol. 12, No. 8, Jan. 1970, Generation of Precision Isolated Circuits on Ceramic, by M. R. Mathers et al., p. 1249.

Primary Examiner—William A. Powell
Attorney, Agent, or Firm—Paul R. Miller

[57] ABSTRACT

In a method of manufacturing an electric discharge device having a pattern of electrodes impressed in a glass plate, the starting material for the manufacture of the pattern of electrodes is a metal foil which has a relief pattern. The relief pattern comprises thick portions which are connected together by thin portions of the foil and in which the thick portions constitute the desired pattern of electrodes. At a temperature $T_1$ which is lower than the melting-point of the metal of the foil and in which the glass of the glass plate has a viscosity of approx. $10^7$ to $10^{13}$ Pa.sec., the surface of the metal foil comprising the relief is impressed in the glass plate. After cooling, the desired pattern of electrodes is obtained by etching away the thin portions of the foil. In order to improve the adhesion, the metal foil can be rigidly adhered to the glass plate by means of an anodic bonding process prior to etching away the thin portions. The invention is particularly suitable for use in the manufacture of gas discharge display panels.

10 Claims, 7 Drawing Figures

METHOD OF MANUFACTURING AN ELECTRIC DISCHARGE DEVICE COMPRISING A GLASS SUBSTRATE HAVING A PATTERN OF ELECTRODES

The invention relates to a method of manufacturing an electric discharge device comprising a pattern of electrodes impressed in a glass plate.

The invention also relates to an electric discharge device manufactured according to the method.

An electric discharge device comprising a pattern of electrodes impressed in a glass plate is disclosed in British Patent Specification 1,370,656. In this device the pattern of electrodes consists of strip-shaped conductors which are first secured to a metal pressure plate and are then impressed in a soft glass plate at elevated temperature. The object is that upon removing the pressure plate, the strip-shaped conductors remain in the glass plate. This method is rather complicated, while upon removing the pressure plate there is a fair chance that damage is done to the glass plates, the electrodes and the pressure plate. Furthermore, the size accuracy of a pattern of electrodes obtained in this manner leaves to be desired when, as is often the case, for example, in gas discharge display panels, a glass plate is to be provided with an extensive pattern of electrodes situated immediately beside each other.

It is the object of the invention to provide a method of manufacturing the electric discharge device, in which a pattern of electrodes impressed in a glass plate is obtained in a simple manner and with great size accuracy.

For that purpose, such a method is characterized according to the invention in that for the manufacture of the pattern of electrodes there is started from a metal foil which is provided with a relief pattern consisting of thick portions connected together by thin portions of the foil in such manner that the thick portions of the foil form the desired pattern of electrodes, the foil is laid on the glass plate with its side comprising a relief pattern, the assembly of foil and glass plate is heated to a temperature $T_1$ which is lower than the melting-point of the metal of the foil, and in which the glass of the glass plate has a viscosity of approx. $10^7$ to $10^{13}$ Pa.sec., the foil is pressed against the glass plate at the temperature $T_1$ so that the relief pattern is impressed in the slightly soft glass, and the desired pattern of electrodes is obtained by removing at least the material forming the thin portions of the foil.

By removing the material forming the thin portions of the foil, the thicker portions impressed in the glass plate remain in accordance with the desired pattern of electrodes. The great advantage of the method according to the invention is that the electrodes are not impressed individually into the glass plate but as parts of a coherent assembly, so that the mutual position of the electrodes is maintained. Furthermore, the method is fast and extremely suitable for mass production. The relief pattern is provided in the metal foil by means of known methods, for example, rolling, pressing, etching and spark erosion.

Pressing the metal foil against the glass plate at the temperature $T_1$ must result in a uniform contact between foil and glass plate. Uniform contact is to be understood to mean herein an intimate surface contact without gas inclusions between the metal foil and the glass plate. According to an embodiment of the invention such a uniform contact is realized in a simple manner when pressing the foil and the glass plate against each other by first pressing the foil against the glass plate over a restricted area and expanding the pressure over an area extending towards the edges of the foil.

The extent to which the pattern of electrodes obtained according to the invention adheres to the glass plate often depends on the metal of which the metal foil consists. According to a further embodiment of the invention the adhesion can be improved after the relief pattern of the metal foil has been impressed into the glass plate by bonding the foil to the substrate by means of anodic bonding. This technique comprises the application of an electric potential difference across the parts to be joined at a temperature $T_2$ with, the surfaces to be bonded together being of parts kept in intimate contact with each other. The temperature $T_2$ is chosen to be so high that the glass plate becomes slightly electrically conductive. During the bonding of the surfaces these are kept in intimate contact with each other as a result of the electric potential difference by electrostatic forces, possibly supplemented by mechanical pressure.

Such a bonding method is disclosed inter alia in U.S. Pat. No. 3,397,278 and U.S. Pat. No. 3,589,905 the contents of which are deemed to be incorporated herein by reference, For further details regarding this bonding method reference is made to these patents.

The metal foil may consist, for example, of copper, nickel, chromium, iron or suitable alloys thereof. According to the invention an aluminium foil is preferably used since this metal is easy to work mechanically and chemically.

According to a further embodiment of the invention an aluminium foil is used in combination with a soft-glass substrate, in particular a soda lime glass substrate. At a temperature $T_1$ of approx. 550° to 600° C. the aluminium foil is pressed against the soft-glass plate with a pressure of approx. $3.10^5$ to $8.10^5$ N/m$^2$, which results in a uniform contact between aluminium foil and glass plate. At a temperature $T_2$ of approx. 230° to 280° C., an electric voltage is applied across the glass substrate and the aluminium foil for at least three minutes, which results in a current of approx. 0.2 to 0.7 A/m$^2$ flowing through the glass and produces a strong bond between the aluminium foil and the substrate. The desired pattern of electrodes if finally obtained by etching away the thin portions of the foil.

The invention is of particular importance for the manufacture of gas discharge display panels, for example, gas discharge display panels the envelope of which comprises at least one glass plate on which a pattern of electrodes is provided. Such patterns of electrodes should be constructed from electrodes which are very accurately defined as regards mutual position and dimensions. The use of aluminium foil is preferred because aluminium is a metal which is easy to work. A pattern of aluminium electrodes provided in a glass plate according to the invention may be provided with an oxide skin locally or entirely by means of anodic oxidation. By providing local oxide skins on the electrodes using photoresist techniques, accurately defined electrode regions not provided with insulation (oxide skin) can be obtained, which is of importance for d.c.-operated display panels having a large resolving power. By providing the whole pattern of electrodes with an oxide skin, a display panel can be obtained which can be a.c.-operated.

The invention also provides a solution as regards problems which present themselves upon sealing together the glass plates in a vaccum-tight manner in display panels. Special measures had often to be taken, for example in the form of silver leadthrough strips, to seal the panel in a vacuum-tight manner at the area where the electrodes are led through. It has been found that such measures are not necessary in display panels manufactured according to the invention. The bonding of the electrodes to the glass substrate is vacuum-tight and the sealing glass, often in the form of a "glass frit", produces a vacuum-tight seal between the glass plates of the panel also at the area where the electrodes are led through.

Figure 2:
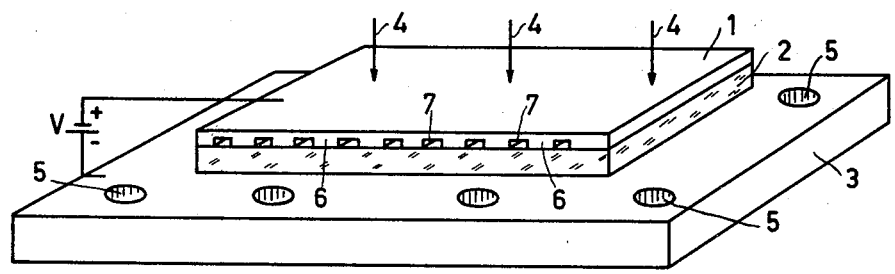
Figure 3:
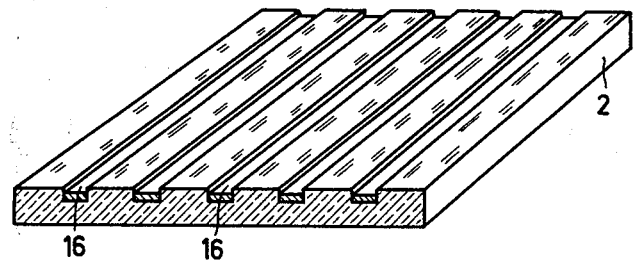
Figure 4:
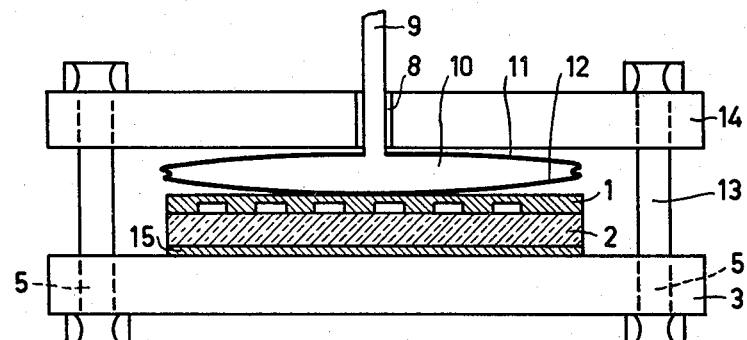
Figure 5:
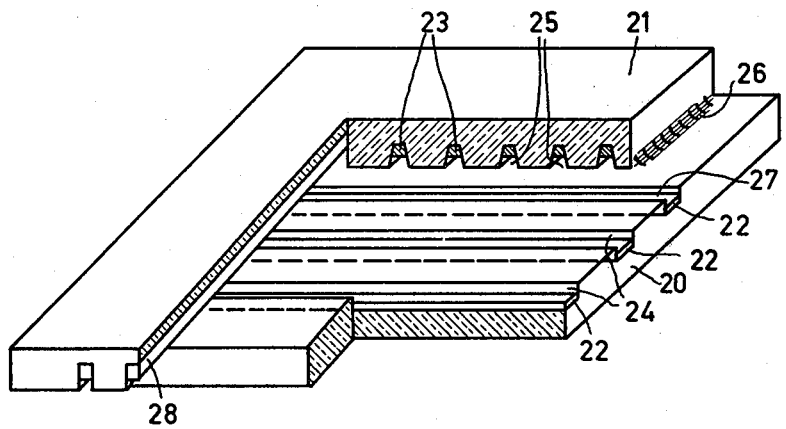
Figure 6A:
Figure 6B:

Embodiments of the invention will now be described in greater detail by way of example, with reference to the drawing, in which:

FIG. 1 is a partly perspective view of a metal foil having a relief pattern,

FIGS. 2 and 3 illustrate the provision in a glass plate of a pattern of electrodes with the metal foil shown in FIG. 1, FIG. 4 shows diagrammatically a device for impressing a metal foil having a relief pattern in a glass plate, FIG. 5 schematically shows a gas discharge display panel having a pattern of electrodes obtained by a method according to the invention, and FIGS. 6a and 6b are sectional views of a few possible relief patterns.

The metal foil 1 shown in FIG. 1 is provided with a relief pattern by rolling, which pattern consists of a plurality of parallel ridges 6 which are joined together by means of thin portions 7. The metal foil 1 consists of aluminium and at the area of the ridges 6 has a thickness of approximately 200 microns, while the thin portions 7 have a thickness of approx. 100 microns. The relief pattern may also be provided by spark erosion, by a photographic etching process, or by impressing it in the foil.

FIG. 2 illustrates the provision of the metal foil 1 on a glass plate 2 consisting of a soda-lime glass which consists essentially of 69.5 wt.% $SiO_2$, 10 wt.% $Na_2O$, 7.5 wt.% $K_2O$, 10 wt.% CaO, and 3 wt.% BaO. With the relief pattern facing the glass plate, the assembly is laid on a stainless steel base plate 3 and heated in a furnace to a temperature $T_1$ of approx. 550° to 600° C. The soda-lime glass at this temperature has a viscosity of approx. $10^{10}$ Pa. sec. After the temperature $T_1$ has been reached, the metal foil is pressed against the glass plate 2 for approx. 60 minutes with a pressure of approx. $5.10^5$ N/m² in the direction of the arrows 4. The ridges 6 are pressed into the slightly soft glass until the thin portions 7 bear on the glass plate 2. The assembly thus obtained is cooled, after which the aluminium foil 1 is adhered to the glass plate 2 by means of "anodic bonding". This step in the manufacturing process is denoted diagrammatically by a voltage element V. The bonding process takes place at a temperature $T_2$ of approx. 250° C. and consists in that an electric potential difference is applied across the glass plate 2 and the foil 1 for approx. 4 minutes, which potential difference results in an electric current of approx. 0.5 A/m² flowing through the glass plate. The foil 1 thus adhered to the glass plate 2 is then subjected to an etching process, the top layer of the foil and hence also the thinner portions 7 of the foil being etched away completely. This operation results in a pattern of electrodes which consists of parallel electrodes (ridges 6) and is sunk in the glass plate. FIG. 3 shows such a pattern of electrodes in the glass plate 2, in which the exposed surface of the electrodes 16 is situated slightly below the upper surface of the glass plate 2, which is realized by subjecting the foil 1 to the etching process slightly longer than is necessary for etching away the thin portions 7. The method described is extremely cheap and results in a pattern of electrodes readily adhering to the glass plate and having an accurate size.

FIG. 4 shows a device with which the relief pattern of the aluminium foil 1 is pressed in the glass plate 2 and which can produce a uniform contact between the aluminium foil 1 and the glass plate 2. By means of a number of bolts 13 which are threaded through apertures 5 of the base plate 3, a steel upper plate 14 is kept at a pre-determined distance from the base plate 3. The upper plate 14 comprises a central aperture 8 through which a tube 9 extends. The tube 9 is connected to a pin-cushion-like expansion vessel 10 which consists of two metal diaphragms 11 and 12 which are sealed together in a vacuum-tight manner at their edges. The assembly formed by the glass plate 2 and the aluminium foil 1 is present between the base plate 3 and the diaphragm 12. The tube 9 is furthermore connected to a compressed air apparatus not shown in the drawing with which a pressure of $3 \times 10^5$ to $8 \times 10^5$ N/m² can be applied to the expansion vessel 10. When pressurizing the expansion vessel 10, the contact surface between the diaphragm 12 and the foil 1 will gradually be increased from the center towards the edges of the foil 1. In this manner the formation of gas inclusions (gas bubbles) between the foil 1 and the glass plate 2 is avoided. A further aluminium foil 15 is present between the base plate 3 and the glass plate 2. The foil 15 serves as an electric contact surface for applying the potential difference across the glass plate 2 and the aluminium foil 1 during the anodic bonding process. With the polarity indicated in FIG. 2 only the foil 1 comprising the relief pattern adheres rigidly to the glass plate 2. After the bonding process the aluminium foil 15 can be removed from the glass plate 2 quite easily.

The device shown in FIG. 4 also presents the possibility of simultaneously providing a number of glass plates with an aluminium foil. Each of the glass plates is provided with a foil 1 and a foil 15 and stacked one on top of the other in the manner described with reference to FIG. 4 and the assembly is compressed at an elevated temperature. A chromium-nickel-iron plate covered on two sides with a graphite layer or boron nitride layer is present between the facing aluminium foils of two successive glass plates, so as to prevent that the aluminium foils of two successive glass plates adhere together.

The method according to the invention is extremely suitable for use in the manufacture of gas discharge display devices. FIG. 5 shows the most elementary form of such a display device which includes a glass bottom plate 20 and a glass top plate 21. A pattern of strip-shaped aluminium electrodes 22 is provided in the bottom plate 20 according to a method described above with reference to FIGS. 1 to 4. The electrodes 22 constitute the cathodes of the display device. In an analogous manner the top plate 21 has been provided with a pattern of strip-shaped electrodes 23 which cross the electrodes 22 and constitute the anodes of the display device. Material has been etched away from the electrodes 22 and 23 to below the surface of the respective glass plates 20 and 21 so that channels 24 and 25 are obtained and the collective depth of the channels determines the spacing between the electrodes 22 and 23. The glass plates 20 and 21 are laid one on top of the other and sealed together in a vacuum-tight manner at their edges by means of a sealing glass 26. The space between the plates 20 and 21 is filled with a suitable ionisable gas, for example, neon or a mixture of neon and argon. By applying a suitable potential difference between a cathode 22 and an anode 23, a glow-discharge is generated at the area where that anode and that cathode cross each other, which discharge is visible through the top plate 21. By scanning the anodes 23 and the cathodes 22 with a sufficiently high frequency in a predetermined sequence with voltage pulses corresponding to the display information, a display built up from discharge points can be displayed which is observed as an apparently continuous light picture. The display panel described here briefly is operated with direct voltage. When the electrodes 22 and 23 consist of aluminium, the panel can be made suitable for a.c.-operation in a simple manner by providing the aluminium electrodes 22 and 23 with a thin oxide skin by means of anodic oxidation.

It is alternatively possible to provide the cathodes 22 with an oxide skin with the exception of small regions at the area where the cathodes cross an anode. In this manner, accurately defined discharge regions are obtained and a discharge panel of high resolving power can be manufactured.

As shown in FIG. 5, the electrodes 22 and 23 are provided with integrally formed extensions 27 and 28, respectively, so as to be able to apply the desired electric voltages to these electrodes. The invention provides a vacuum-tight adhesion of the extensions 27 and 28 to the glass plates 20 and 21, respectively. Due to this vacuum-tight adhesion, a vacuum-tight seal of the discharge panel is also obtained at the area of the extensions by means of the sealing glass 26.

FIGS. 6a and 6b are side-sectional elevations of two possible forms of relief patterns. The relief patterns have been obtained by means of rolling, which has the advantage, as compared with etched patterns, that, as shown in FIG. 6b, the ratio h/b may be larger than one. This presents the possibility of manufacturing an electrode pattern having closely juxtaposed electrodes which have been impressed into the glass plate to a depth which is greater than the distance between adjacent electrodes.

What is claimed is:

1. A method of manufacturing an electric discharge device comprising the steps of forming a metal foil with a relief pattern having a plurality of thick portions joined by thin portions, placing said metal foil on a glass plate with said relief pattern in contact with said glass plate, heating the assembly of metal foil and glass plate to a temperature $T_1$ lower than the melting point of the metal foil and wherein said glass plate has a viscosity of $10^7$ to $10^{13}$ Pa. sec., pressing said relief pattern of said metal foil into said glass plate until said thin portions at least bear on said glass plate, bonding said metal foil to said glass plate by anodic bonding, and removing at least said thin portions of said metal foil to form a pattern of electrodes of said thick portions in said glass plate.

2. A method according to claim 1, wherein said metal foil is initially pressed against said glass plate over a restricted area with the restricted area being extended toward edges of said metal foil in order to achieve uniform contact between said metal foil and said glass plate.

3. A method according to one of claims 1 or 2, wherein said metal foil consists of aluminium.

4. A method according to claim 3, wherein said glass plate is a soda lime glass.

5. A method according to claim 4, wherein said relief pattern of aluminium metal foil is pressed against said soda lime glass at said temperature $T_1$ of approximately 550° to 600° C. under a pressure of approximately $3 \times 10^5$ to $8 \times 10^5$ N/m$^2$, wherein said anodic bonding is carried out by applying an electric voltage across said assembly for at least three minutes at a temperature $T_2$ of approximately 230° to 280° C., said electric voltage resulting in a current of approximately 0.2 to 0.7 A/m flowing through said glass plate, and wherein said thin portions are removed by etching to obtain said pattern of electrodes.

6. A method according to claim 5, wherein said etching is carried out until said thick portions are below the level of said glass plate.

7. A method according to claim 1, wherein said relief pattern is formed on said metal foil by one of rolling, pressing, etching, or spark erosion.

8. A method according to claim 1, wherein a plurality of patterns of electrodes in glass plate is formed by stacking in series combinations of a first metal foil, a glass plate, and a second metal foil with said relief pattern, and wherein a metal plate with a coating on both sides is inserted between each combination.

9. A method according to claim 8, wherein said metal plate is a chromium-nickel-iron plate, and wherein said coating is one of a graphite layer or a boron nitride layer.

10. A method according to claim 1, wherein at least a portion of said pattern of electrodes is provided with an oxide coating.

* * * * *